(12) United States Patent
McAlpine et al.

(10) Patent No.: US 11,168,151 B2
(45) Date of Patent: Nov. 9, 2021

(54) PRODUCTION OF CRYSTALLINE CELLULOSE

(71) Applicant: NANO-GREEN BIOREFINERIES INC., Saskatoon (CA)

(72) Inventors: Sean McAlpine, Saskatoon (CA); Jory Nakoneshny, Saskatoon (CA)

(73) Assignee: NANO-GREEN BIOREFINERIES INC., Saskatoon (CA)

( * ) Notice: Subject to any disclaimer, the term of this patent is extended or adjusted under 35 U.S.C. 154(b) by 0 days.

(21) Appl. No.: 16/073,310

(22) PCT Filed: Jan. 27, 2017

(86) PCT No.: PCT/CA2017/050096
§ 371 (c)(1),
(2) Date: Jul. 26, 2018

(87) PCT Pub. No.: WO2017/127938
PCT Pub. Date: Aug. 3, 2017

(65) Prior Publication Data
US 2019/0040158 A1   Feb. 7, 2019

Related U.S. Application Data

(60) Provisional application No. 62/288,185, filed on Jan. 28, 2016.

(51) Int. Cl.
| | | |
|---|---|---|
| *C08B 15/02* | (2006.01) | |
| *C30B 7/14* | (2006.01) | |
| *C30B 29/58* | (2006.01) | |
| *C08H 8/00* | (2010.01) | |
| *C30B 29/60* | (2006.01) | |
| *C30B 29/62* | (2006.01) | |

(52) U.S. Cl.
CPC ........... *C08B 15/02* (2013.01); *C08H 8/00* (2013.01); *C30B 7/14* (2013.01); *C30B 29/58* (2013.01); *C30B 29/60* (2013.01); *C30B 29/62* (2013.01)

(58) Field of Classification Search
CPC .................... C08B 15/02; C08H 8/00
See application file for complete search history.

(56) References Cited

U.S. PATENT DOCUMENTS

| | | |
|---|---|---|
| 2,078,446 A | 4/1937 | Grigg |
| 2,978,446 A | 4/1961 | Battista et al. |
| 3,146,168 A | 8/1964 | Battista et al. |
| 4,266,981 A | 5/1981 | Tsao et al. |
| 4,314,854 A | 2/1982 | Takagi |
| 4,347,103 A | 8/1982 | Rende |
| 4,480,089 A | 10/1984 | Chen |
| 5,194,416 A | 3/1993 | Jureller et al. |
| 5,580,974 A | 12/1996 | Banker et al. |
| 6,037,380 A | 3/2000 | Venables et al. |
| 6,042,769 A | 3/2000 | Gannon et al. |
| 6,046,375 A | 4/2000 | Goodell et al. |
| 6,120,556 A | 9/2000 | Nishino et al. |
| 6,258,208 B1 | 7/2001 | Lindeberg et al. |
| 6,554,958 B1 | 4/2003 | Devic |
| 7,669,292 B2 | 3/2010 | Chute et al. |
| 7,700,764 B2 | 4/2010 | Heijnesson-Hulten |
| 8,778,136 B2 | 7/2014 | Nonni et al. |
| 8,900,706 B2 | 12/2014 | Leung et al. |
| 2003/0083491 A1 | 5/2003 | Komen et al. |
| 2005/0187126 A1 | 8/2005 | Busch et al. |
| 2005/0269048 A1 | 12/2005 | Rodriguez |
| 2006/0124124 A1 | 6/2006 | Soni et al. |
| 2006/0260773 A1 | 11/2006 | Tan et al. |
| 2006/0289132 A1 | 12/2006 | Heijnesson-Hulten |
| 2009/0205143 A1 | 8/2009 | Hage et al. |
| 2010/0151159 A1 | 6/2010 | Beck et al. |
| 2010/0159569 A1 | 6/2010 | Medoff et al. |
| 2010/0233481 A1 | 9/2010 | Isogai et al. |
| 2010/0288456 A1 | 11/2010 | Westland et al. |
| 2010/0311139 A1 | 12/2010 | Baures et al. |
| 2012/0040411 A1 | 2/2012 | Henriksson et al. |
| 2012/0043038 A1 | 2/2012 | Dodd |
| 2012/0175073 A1 | 7/2012 | Nonni et al. |
| 2013/0248128 A1 | 9/2013 | Rector et al. |
| 2014/0200335 A1 | 7/2014 | Olkowski |

FOREIGN PATENT DOCUMENTS

| | | |
|---|---|---|
| GB | 555985 | 9/1943 |
| RU | 2387669 C2 | 4/2010 |
| RU | 2425715 C1 | 8/2011 |
| WO | 9400234 A1 | 1/1994 |
| WO | 99109244 | 2/1999 |
| WO | 0159204 A1 | 8/2001 |
| WO | 2006119392 A1 | 11/2006 |
| WO | 2007001229 A1 | 1/2007 |

(Continued)

OTHER PUBLICATIONS

Nevell, T. et al., Textile Research Journal, "Effect of Manganese (II), Cobalt (II), and Copper (I) Hydroxides on the Kinetics of the Oxidation of Cellulose by Hypochlorite", 1986, pp. 270-280 (Year: 1986).*
Park et al. Cellulose crystallinity index: measurement techniques and their impact on interpreting cellulase performance, Biotechnol Biofuels. 2010; 3:10.
Conversion of Lignocellulosic Biomass to Nanocellulose: Structure and Chemical Process. Lee et al. The Scientific World Journal, vol. 2014 (2014), Article ID 631013, 20 pages, Published Aug. 27, 2014.
Abbaslou, R. M. M., Tavasoli, A. and Dalai, A.K. 2008. Effect of pre-treatment on physico-chemical properties and stability of carbon nanotubes supported iron Fischer—Tropsch catalysts. Applied Catalysis A: General 355 (2009) 33-41.
Bai, W., Holbery, J. and Li, K. 2009. A technique for production of nanocrystalline cellulose with a narrow size distribution. Cellulose 16, 455-465.

(Continued)

*Primary Examiner* — Bahar Craigo
(74) *Attorney, Agent, or Firm* — Bennett Jones LLP

(57) ABSTRACT

A method of producing crystalline cellulose from a cellulosic material includes the step of reacting the cellulosic material in an aqueous slurry comprising a transition metal catalyst and a hypohalite solution.

18 Claims, 14 Drawing Sheets

(56) References Cited

FOREIGN PATENT DOCUMENTS

| WO | 2010138941 A1 | 12/2010 |
| WO | 2010138941 A2 | 12/2010 |
| WO | 2011050359 A1 | 4/2011 |
| WO | 2011072365 A1 | 6/2011 |
| WO | WO2013000074 A1 * | 1/2013 |
| WO | 2013162421 A1 | 10/2013 |
| WO | 2013162422 A2 | 10/2013 |
| WO | 2015028719 A1 | 3/2015 |

OTHER PUBLICATIONS

Barbusinski, K. 2009. Fenton reaction—controversy concerning the chemistry. Ecological Chemistry and Engineering 16, 247-258.
Cherubini, F. and Stromman, A.H. 2011. Chemicals from lignocellulosic biomass: opportunities, perspectives, and potential of biorefinery systems. Biofuels, Bioprod. Bioref. 5: 548-561.
Duran, N. et al. 2011. A Minireview of cellulose nanocrystals and its potential integration as co-product in bioethanol production. J Chil Chem Soc., 56, No. 2.
Filson, P.B. and Dawson-Andoh, B.E. 2009. Sono-chemical preparation of cellulose nanocrystals from lignocellulose derived materials. Bioresource Technology 100: 2259-2264.
Harmsen, P., Huijgen, W., Bermudez, L. and Bakker, R. 2010. Literature Review of Physical and Chemical Pretreatment Processes for Lignocellulosic Biomass. Report 1184, Wageningen UR Food & Biobased Research, Wageningen, The Netherlands. ISBN 978-90-8585-757-0.
Hirota, M., Tamura, N., Saito, T. and Isogai, A. 2010. Water dispersion of cellulose II nanocrystals prepared by TEMPO-mediated oxidation of mercerized cellulose at pH 4.8. Cellulose 17:279-288.
Isogai, A., Saito, A. and Fukuzumi, H. 2011. TEMPO-oxidized cellulose nanofibers. Nanoscale 3, 71-85.
King, D. 2010. The Future of Industrial Biorefineries. King, D. Ed. World Economic Forum. REF: 210610; www3.weforum.org/docs/WEF.sub.—FutureIndustrialBiorefineries.sub.—Repor-t.sub.-2010.
Klemm, D., Kramer, F., Moritz, S., Lindstrom, S., Ankerfors, M., Gray, D. and Dorris, A. 2011. Nanocelluloses: A New Family of Nature-Based Materials. Angew. Chem. Int. Ed. 50, 5438-5466.
Leung, A.C. W., Hrapovic, S., Lam, E., Lui, Y., Male, K.B., Mahmoud, K.A. and Luong, J.H.T. 2011. Characteristics and Properties of Carboxylated Cellulose Nanocrystals Prepared from a Novel One-Step Procedure. Small 7, 3, 302-305.
Minotti, G. and Aust, S.D. 1989. The role of iron in oxygen radical mediated lipid peroxidation. Chemico-Biological Interactions 71 (1): 1-19.
Mishra, S.P., Manent, A.S. , Chabot, B. and Daneault, C. 2012. Production of nanocellulose from native cellulose—various options utilizing ultrasound. BioResources 7: 422-436.
Neyens, E., Baeyens, J. 2003. A review of classic Fenton's peroxidation as an advanced oxidation technique. Journal of Hazardous Materials B98, 33-50.
Pierre, J.L., Fontecave, M. 1999. Iron and activated oxygen species in biology: The basic chemistry. BioMetals 12: 195-199.
Pierre, J.L., Gautier-Luneau, I. 2000. Iron and citric acid: A fuzzy chemistry of ubiquitous biological relevance: BioMetals 13: 91-96.
Saito, T., Kimura, T., Nishiyama, Y. and Isogai, A. 2007. Cellulose Nanofibers Prepared by TEMPO-Mediated Oxidation of Native Cellulose. Biomacromolecules 8, 2485-2491.
Sixta, H. 2006. Handbook of Pulp. H. Sixta Ed. WILEY-VCH Verlag GmbH &Co. KGaA, Weinheim, Germany.
Sixta, H., Suss, H-U., Potthast, A., Schwanninger, M. and Krotscheck, A.W. 2006. Pulp Bleaching in Handbook of Pulp. H. Sixta Ed. Wiley-VCH Verlag GmbH &Co. KGaA, Weinheim, Germany. vol. 2, Chapter 7, p. 609.
Surisetty, V.R., Dalai, A. K. and Kozinski, J. 2010. Intrinsic reaction kinetics of higher alcohol synthesis from synthesis gas over a sulfided alkali-promoted Co—Rh—Mo trimetallic catalyst supported on Multiwalled Carbon Nanotubes (MWCNTs). Energy & Fuels 24 (8), 4130-4137.
Swern, D. 1971. Organic Peroxides in Organic Peroxides, D. Swern, Eds., Wiley-Interscience, New York, vol. 2, 963 pp.
Wink, D.A., Wink, C.B., Nims, R.W., Ford, P.C. 1994. Oxidizing Intermediates Generated in the Fenton Reagent: Kinetic Arguments Against the Intermediacy of the Hydroxyl Radical. Environ Health Perspect 102 (Suppl 3): 11-15 (1994).
J.A. Epstein, and M. Lewin, Kinetics of the oxidation of cotton with hypochlorite in the pH range 5-10, Journal of Polymer Science, Apr. 1962, p. 991-1008, vol. 58, New York, US.

* cited by examiner

PRODUCTION OF CRYSTALLINE CELLULOSE

FIELD OF THE INVENTION

The present invention relates to methods of producing crystalline cellulose using transition metal catalyzed oxidation reactions.

BACKGROUND

It is well-known in the art to process biomass such as wood and other lignocellulosic material to obtain cellulose through processes such as Kraft pulping and bleaching processes, including elemental chlorine free (ECF) and total chlorine free (TCF) bleaching. Wood chips are digested in a Kraft digester to produce brown pulp which has a kappa number (K) of about 25, which is an indication of the residual lignin content or bleachability of the pulp. The brown pulp is screened and then passed through an oxygen delignification process, followed by usually several steps of hydrogen peroxide, chlorine and/or chlorine dioxide bleaching and filtering and drying, to reduce the K to less than about 5, and produce Kraft bleached pulp.

Microfibrillated cellulose (MFC), also known as cellulose nanofibrils and microfibrils, is generated by applying mechanical delamination to a suitable cellulose source. This treatment causes extensive defibrillation of the cellulose fibrils. The resulting product is composed of fibrils with large aspect ratios. The diameter of the fibrils is from about 5 to 60 nm, and the length can be several microns long. No acid digestion takes place and these fibrils do not have increased crystallinity compared to the parent material and are not considered to be crystalline cellulose. It is common to chemically treat the source material to degrade the cellulose fiber structure before mechanical treatment. Thus, mechanical delamination in MFC production can be enhanced by decreasing the resistance of the fibrils through oxidation of cellulose fibers using a transition metal salt and an oxidant such as hydrogen peroxide, persulfate salts or TEMPO (2,2,6,6-tetramethylpiperidine-1-oxyl radical). One major drawback of the MFC production process is its very high energy requirement to achieve the required physical delamination.

Microcrystalline cellulose (MCC) is a valuable biopolymer used in the food and pharmaceutical sectors and in industrial applications such as in oil, gas and mining. The predominant industrial process for generating MCC is acid hydrolysis, where highly pure cellulose such as dissolving grade alpha cellulose or Kraft pulp is digested with a strong mineral acid, followed by a physical size reduction. Digestion with hydrochloric or sulfuric acid removes amorphous domains within cellulose fibrils, leaving fragments of cellulose fibrils with high crystallinity. However, the yield of MCC from cellulose in industrial production may be as low as 30%. MCC particles may range in size from about 30 microns to about 100 microns or larger. MCC is usually processed and sorted to achieve specific ranges in size and form depending on the desired application. MCC can be further processed such as through blending with attriting aids, grinding, homogenization, microfluidization or treatment with ultrasound to achieve smaller sizes, down to about 1 micron, which may be suspended in water to generate a suspension with colloidal properties.

The predominant production process for MCC using acid hydrolysis is expensive due to high capital and operating costs, and the use of corrosive mineral acids is problematic with respect to safety and environment. In addition, the tight control requirements of sulfuric acid concentration and temperature makes it necessary to use dried pulp as the biomass source.

Production of cellulose nanocrystals (CNC) is similar to that of MCC production, consisting of digestion with a strong mineral acid (such as 64% sulfuric acid), followed by mechanical size reduction (Klemm et al., 2011). Diverse parent materials can be used but wood pulp is predominant. CNC fragments (also known as whiskers, nanowhiskers or nanocrystalline cellulose) are generated with variable sizes reported in the literature (widths from 5 to 70 nm and lengths from 100 to about 1000 nm). Physical properties of CNC are strongly influenced by source of parent material, the type of acid used in digest (hydrochloric or sulfuric), charge and dimensions. Several mechanical size reduction processes can be used following acid digestion, such as ultrasonic treatment, cryogenic crushing and grinding, and homogenization such as fluidization, which may also increase yield. CNC may also be generated from MCC using strong mineral acid hydrolysis followed by separation by differential centrifugation, which results in a narrow size distribution of the CNC (Bai et al., 2009). The use of strong mineral acid hydrolysis for the production of CNC either from biomass sources or from MCC encounters the same economic, environmental and safety limitations as for the production of MCC.

It is also known to produce crystalline cellulose using hydrogen peroxide chemistry which may involve modified Fenton or Haber Weiss reactions, involving a transition metal catalyst. However, such reactions may be lengthy and typically produce crystalline cellulose of heterogenous morphology and size fractions, requiring further processing.

There is a need in the art for improved methods of producing crystalline cellulose.

SUMMARY OF THE INVENTION

In one aspect, the present invention may comprise a method of producing crystalline cellulose from a cellulosic material, comprising the steps of:

(a) reacting the cellulosic material in an aqueous slurry comprising a transition metal catalyst and a hypohalite solution having an initial pH greater than about 6.0 and a final pH less than about 9.0; and (b) recovering a crystalline cellulose fraction.

In one embodiment, the hypohalite salt comprises an oxyanion containing a halogen in a +1 oxidation state, and may include sodium or calcium salts of hypochlorite, hypoiodite, or hypobromite.

In one embodiment, the initial pH of the slurry is greater than about 7.0 and preferably between about 9.0 to about 12.0, and has an oxidation-reduction potential of greater than about 500 mV. The ORP will drop rapidly when the hypohalite is consumed, and the pH will more gradually drop to less than about 9.0, and preferably less than about 8.0, and more preferably less than about 7.0. In one embodiment, a buffer may be used to control pH during or upon completion of the reaction.

In one embodiment, the oxidation reaction is allowed to proceed to completion based on a significant drop of oxidation-reduction potential, and the oxidation reaction is then repeated to produce the crystalline cellulose. Preferably, the resulting cellulosic material after the first oxidation step is washed in an alkaline solution before subjected to a subsequent oxidation step.

In another aspect, the invention may comprise a method of producing cellulose nanocrystals (CNCs) from a cellulosic material, comprising the steps of:

(a) reacting the cellulosic material in an aqueous slurry comprising a transition metal catalyst and a hypohalite solution; (b) washing the cellulosic material in an alkaline solution; (c) repeating step (a), and (d) recovering a CNC fraction.

BRIEF DESCRIPTION OF THE DRAWINGS

In the drawings, like elements are assigned like reference numerals. The drawings are not necessarily to scale, with the emphasis instead placed upon the principles of the present invention. Additionally, each of the embodiments depicted are but one of a number of possible arrangements utilizing the fundamental concepts of the present invention.

DETAILED DESCRIPTION OF PREFERRED EMBODIMENTS

The present invention relates to methods of producing crystalline cellulose from a cellulosic material.

Figure 1A:
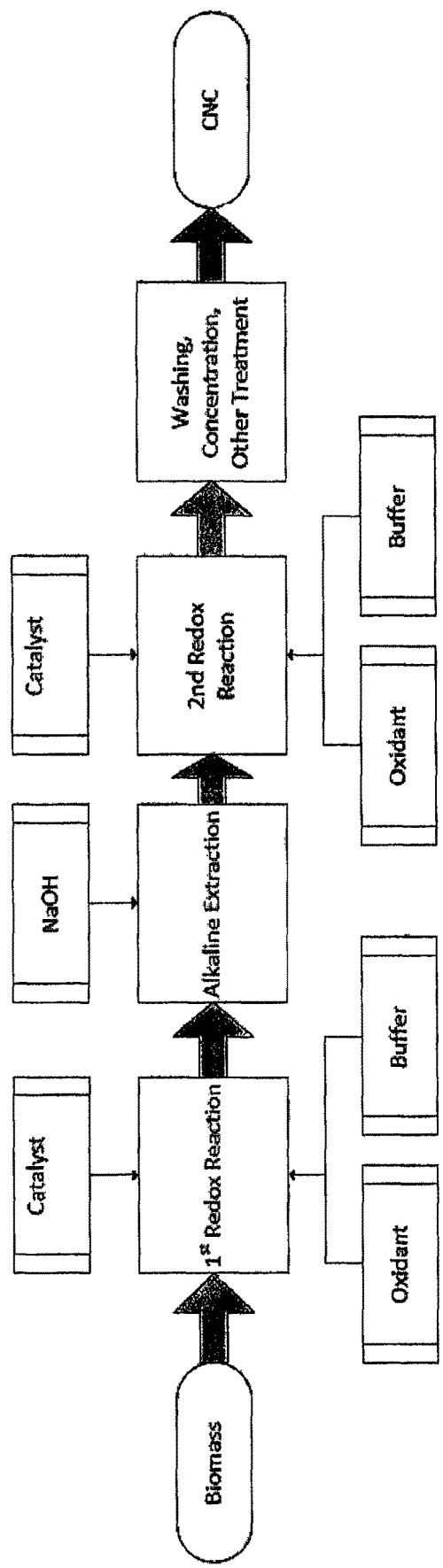
FIG. 1A is a schematic representation of one method of the present invention.

In one embodiment, the invention comprises steps to generate cellulose nanocrystals (CNC) from a lignocellulosic biomass, one example of which is shown schematically in FIG. 1A. The primary steps of the process comprise a first redox reaction, followed by an alkaline extraction and a second redox reaction. The resulting material may be washed, concentrated and/or mechanically treated. As used herein, a "redox reaction" is a reaction where one species is oxidized while another is reduced. In this invention, the hypohalite is reduced as it oxidizes the cellulosic material.

Cellulosic material may include any material which comprises a substantial proportion of cellulose, and may include lignocellulosic biomass and purified forms of cellulose. Lignocellulosic biomass includes, but is not limited to, agricultural crops, residues and byproducts from processing, such as wheat straw, flax straw, hemp straw, chaff, grasses, hay, grains and meals, oat hulls, rice hulls, corn stover, corn husks, sugarcane bagasse, weeds, aquatic plants, hay, cotton waste, animal or human waste; forestry products, residues and byproducts from processing wood, including hardwood or softwood, wood pulp, Kraft pulp, thermomechanical or chemithermalmechanical pulp, Kraft brown pulp, pulping waste and byproducts such as Kraft brown pulp shives, paper products and paper waste, damaged wood such as Mountain Pine Beetle damaged wood; and peat. Purified forms of cellulose may include alpha-cellulose or dissolving grade pulp.

The primary constituents of lignocellulosic biomass are lignin, hemicellulose and cellulose. Cellulose is a polysaccharide comprising D-glucose units in linear and branched chains. The linear chains are ordered in a parallel structure in crystalline regions, however, there are para-crystalline and amorphous regions which lack such order and structure. The amorphous regions are more susceptible to acid hydrolysis, and thus crystalline cellulose is conventionally produced by acid hydrolysis to digest and remove the amorphous regions. Crystalline cellulose comprises cellulose where at least a portion of the amorphous cellulose present in the cellulosic material has been removed, leaving a greater proportion of the cellulose in crystalline form.

Crystalline cellulose may be recovered as either microcrystalline cellulose, or as nanocrystals, or a mixture comprising both. As used herein, microcrystalline cellulose or MCC comprises crystalline cellulose particles having at least one dimension greater than about 1 micron but less than about 1 mm, and preferably less than about 500 microns, or 300 microns. MCC particles may be elongated and have a diameter less than 1 micron but have a length much greater than 1 micron.

Cellulose nanocrystals or CNCs are particles comprising crystalline cellulose where all relevant dimensions are less than about 1 micron. CNC particles are typically long high aspect crystals, having a diameter less than about 50 nm, and a length greater than about 100 nm. In one preferred embodiment, CNC has an average length of about 100 nm to about 150 nm and an average diameter of about 10 nm. CNC typically has much higher aspect ratio than MCC, and may be in the range of about 10 to about 70.

In one embodiment, crystalline cellulose is cellulose having a crystallinity index (CI) which is at least about 10% greater, and preferably at least 20%, 25% or 30% greater than the CI of the cellulosic material prior to the reaction, wherein the CI is measured by any suitable method, provided that the same method is used in each case. In one embodiment, the crystalline cellulose has a CI of at least about 50%, and preferably greater than about 60, 70, 80 or 90%. Crystallinity index may be measured by X-ray diffraction using a peak height method, a peak deconvolution method, an amorphous subtraction method, or an NMR method. (Park et al. Cellulose crystallinity index: measurement techniques and their impact on interpreting cellulase performance, Biotechnol Biofuels. 2010; 3: 10).

CI measurements using a peak height method typically result in a CI higher than with other methods. Table 1 below shows the crystallinity index of several known cellulosic materials and commercial MCC products, using the various methods described above.

|  | XRD method | | | NMR method |
| --- | --- | --- | --- | --- |
| Cellulose tested | Peak height | Peak deconvolution | Amorphous subtraction | C4 peak separation |
| BMCC | 95.2 | 73.1 | 82.4 | 73.8 |
| Avicel PH-101* | 91.7 ± 1.5 | 60.6 ± 1.0 | 77.7 ± 1.9 | 56.7 ± 2.2 |
| SigmaCell 50 | 91.2 | 61.3 | 79.4 | 56.1 |
| SigmaCell 20 | 84.8 | 64.2 | 67.0 | 52.6 |
| JT Baker cellulose | 85.5 | 61.5 | 69.1 | 49.1 |
| Fluka cellulose | 82.9 | 52.9 | 61.6 | 48.6 |
| SolkaFloc cellulose | 78.3 | 56.8 | 57.2 | 43.9 |
| Sigma α-cellulose | 78.0 | 55.9 | 54.4 | 41.5 |

BMCC, bacterial microcrystalline cellulose.
Values are means.

In one aspect, the invention comprises a method of processing a cellulosic material, which may be in dried form, hydrated, or as an aqueous suspension, using a hypohalite salt and a transition metal catalyst to produce crystalline cellulose, preferably substantially pure CNC. As used herein, "substantially pure CNC" means that less than 50%, 40%, 30%, 20% or 10% of the resulting crystalline cellulose is not CNC. One method of determining homogeneity of CNC is to determine particle size distribution. Substantially pure CNC typically will demonstrate a single peak below about 1 micron, with few particles greater than 1 micron in size.

In one embodiment, the catalyst is combined with the hypohalite salt and the biomass feedstock, to promote reactions where the biomass is depolymerized and fractionated, and where amorphous cellulose may be digested. The remaining cellulose may be recovered as a solid fraction while degraded lignin and hemicellulose fractions remain in solution. After a single redox reaction, the cellulose fraction may comprise high-quality cellulose, which may include a large proportion of crystalline cellulose. In one preferred embodiment, and particularly after a second redox reaction, the recovered cellulose comprises cellulose nanocrystals (CNC), which may be substantially pure, and of relatively homogenous size. For example, the recovered CNC may have a single peak of size distribution, where the average particle size is less than about 300 nm, or 200 nm, or 100 nm.

Particle size and distribution may be measured by any known technique. In one embodiment, dynamic light scattering or quasi-elastic light scattering is used to measure particle size and distribution.

In one embodiment, the process may be applied to lignocellulosic biomass feedstock to produce a cellulosic material which is at least about 80% or 90% (by weight) cellulose. This cellulosic material may then be used to produce crystalline cellulose. Alternatively, the process may be applied to a cellulosic material comprising a purified form of cellulose produced by an oxidation step of the present invention, or any other means, such as Kraft pulp, dissolving pulp, alpha cellulose, or MCC. In one embodiment, the method may be used to treat MCC to reduce its average particle size or to produce CNC particles, or a crystalline cellulose with increased CNC content.

The cellulosic material is preferably finely divided and may be suspended in a water slurry, which may comprise about 1% to 15% (w/v) of dry weight of cellulosic material, preferably between about 2% to about 10%. The cellulosic material should then be agitated until dispersed and substantially hydrated.

The hypohalite salt may be added to achieve a concentration of 0.05M to about 1.0M, preferably between about 0.10M to about 0.5M. The amount of hypohalite may be adjusted to the amount of cellulosic material and/or the purity of the cellulosic material, and may be in the range of about 1 mol chlorine per kg of cellulosic material to about 10 mol/kg (dry weight) in one reaction. If the reaction is repeated, then the total amount of chlorine applied may be between about 2 to about 20 mol/kg. In one preferred embodiment, the hypohalite comprise sodium hypochlorite, which is commercially available in trade concentrations ranging from about 3% to about 20% (w:v). A trade concentration of 8% has a specific gravity of about 1.11, about 7.2% available chlorine, and 7.6% weight percent NaOCl. A trade concentration of 12% has a specific gravity of about 1.17, about 10.4% available chlorine, and comprises about 10.9% weight percent NaOCl.

Figure 1B:
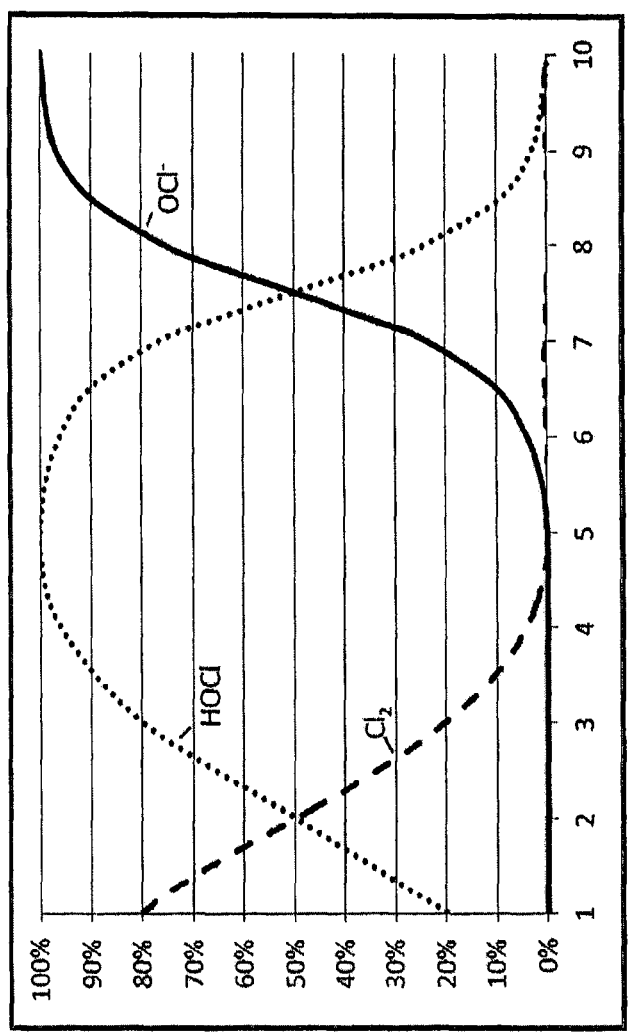
FIG. 1B is a graph showing pH driven equilibrium of chlorine, hypochlorous acid and hypochlorite.

Chlorine is soluble in water to about 7000 ppm at 20° C. and reacts with water forming hypochlorous acid (HOCl). In alkali solutions, hypochlorous acid dissociates, forming hypochlorite (OCl—). Chlorine, hypochlorous acid and hypochlorite exist together in equilibrium, which equilibrium is pH sensitive, as shown in FIG. 1B.

In one embodiment, the transition metal catalyst may comprise any suitable transition metal, such as iron, copper, manganese, molybdenum, rhodium or cobalt. The catalyst may be provided as a salt dissolved in solution, or may be provided on an insoluble support. The transition metal catalyst may comprise ferric ($Fe^{3+}$), cupric ($Cu^{2+}$) ions or manganous ($Mn^{2+}$), such as ferric sulphate ($Fe_2(SO_4)_3$), cupric sulphate ($CuSO_4$), or manganous sulphate ($Mn_2SO_4$), and may be added to achieve a minimum concentration of about 0.01 mM. The catalyst preferably has a concentration between about 0.045 mM to 0.67 mM. The ratio of transition metal ion to cellulosic material may be in the range of about 0.1 mg/g to about 5 mg/g, and preferably between about 0.2 mg/g to about 1.0 mg/g.

In one embodiment, the transition metal catalyst may be chelated with a chelating agent, such as EDTA or a polyvalent organic acid, such as citric acid. Iron and manganese catalysts appear to perform better with a chelating agent, while copper catalysts appear to work well without it.

In one embodiment, the treatment solution is optionally prepared with an aqueous buffer which attempts to maintain the pH between about 4.0 and 8.0, preferably between about 6.0 to about 8.0. Because hypohalite solutions have a pH greater than about 12, the initial pH of the reaction mixture may be greater than 7.0, and in the range of between about 10 to about 12. As the hypohalite is consumed, and acidic by products of the reaction are produced, the pH will gradually be reduced to below 9.0, preferably below about 8.0 and more preferably below about 7.0. However, it is preferable to ensure that the pH does not drop to less than about 4.0, due to the possibility of halogen gas generation. Accordingly, the buffer may control the pH of the mixture as the hypohalite is consumed. In one embodiment, the buffer may comprise a phosphate buffer such as trisodium phosphate and an organic acid, preferably a polyvalent carboxylic acid such as citric acid. In another embodiment, a hydroxide may be added to the reaction, either initially or gradually as the reaction continues, in order to prevent the terminal reaction pH from dropping below a desired value.

The rate of the reaction is at least partially temperature dependent. The temperature may range from about room temperature to 95° C. It is not desirable to exceed 100° C., and the reaction proceeds quite slowly at room temperature. Therefore, in one embodiment, the temperature may be between about 50° and 95° C., and preferably between about 65° C. to about 85° C.

The length of the reaction will depend, at least in part, on the reaction rate and the original amount of the hypohalite. As the hypochlorite is consumed by the reaction and disappears, the ORP of the reaction mixture will rapidly decrease. In aqueous solutions, oxidation-reduction potential (ORP) is a measure of the tendency of the solution to either gain or lose electrons when it is subject to change by introduction of a new species. A solution with a higher ORP than the new species will have a tendency to gain electrons from the new species (i.e. to be reduced by oxidizing the new species) and a solution with a lower (more negative) reduction potential will have a tendency to lose electrons to the new species (i.e. to be oxidized by reducing the new species). ORP values of aqueous solutions are determined by measuring the potential difference between an inert sensing electrode in contact with the solution and a stable reference electrode connected to the solution by a salt bridge The initial ORP may be about +500 to about +1000 mV, and will increase slightly but stay in that range as the reaction proceeds. Once the hypohalite has been consumed, the ORP will drop rapidly to about 0.0 or a negative value. At this point, additional hypohalite may be added to continue the reaction if desired.

Figure 2:
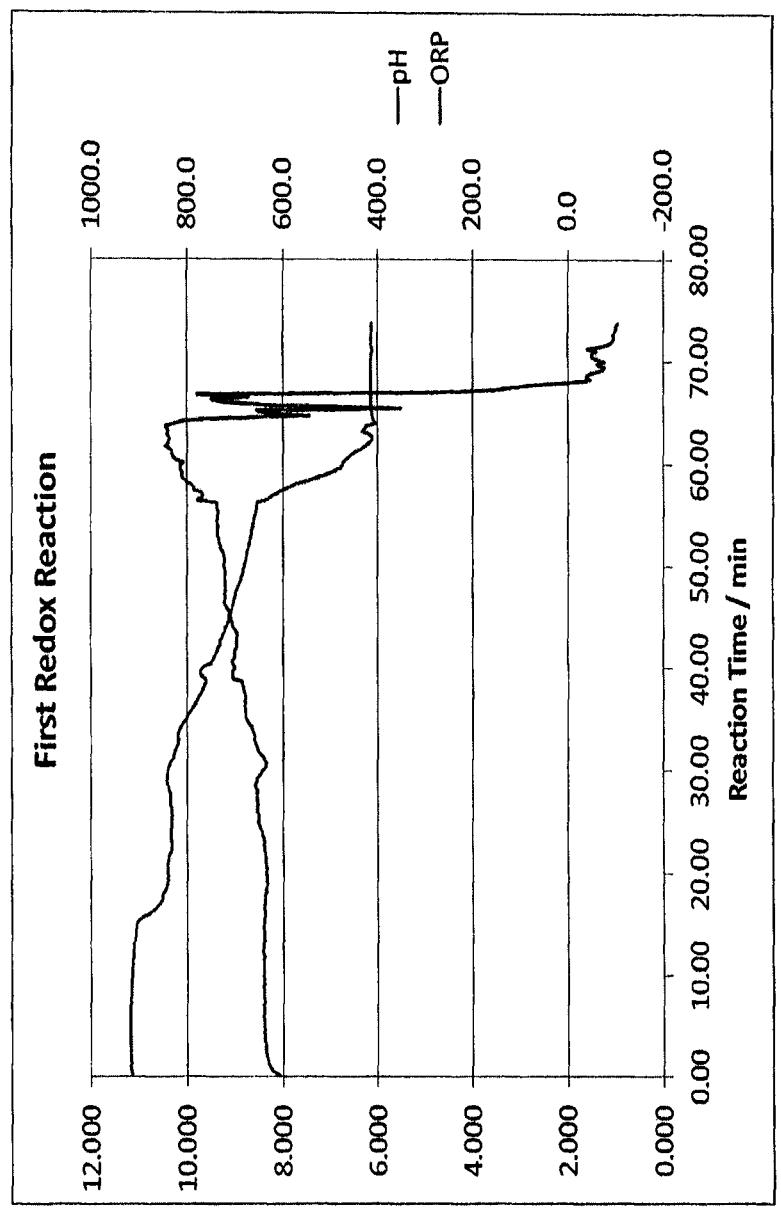
FIG. 2 shows a graph plotting pH and oxidation-reduction potential (ORP) during a redox reaction of the present invention.
Figure 4:
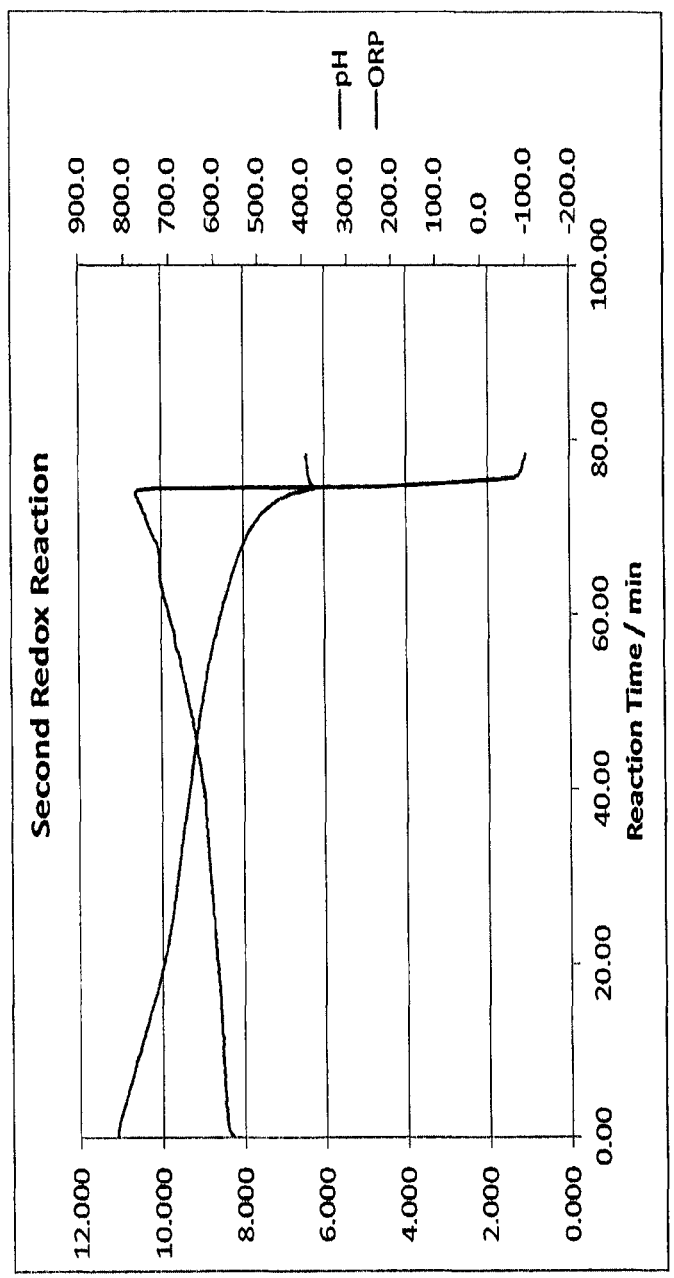
FIG. 4 shows a graph plotting pH and oxidation-reduction potential (ORP) during a second redox reaction of the present invention, after a first redox reaction and an alkaline extraction.

As shown in FIGS. 2 and 4, one feature of the present invention is the reaction phase where ORP has remained the same or increases slightly, while pH is slowly decreasing. In one embodiment, the endpoint of the reaction is marked by a sudden and large drop in ORP and stabilization of the pH below about 9.0, and preferably between about 6.0 and 6.5.

Once the first redox reaction has proceeded, the cellulose fraction remains as a solid, while the lignin and hemicellulose fractions have largely dissolved in the aqueous slurry. Some portion of the amorphous domains may also have been solubilized. Thus, the solid cellulose fraction may be separated by any suitable means, such as centrifugation or filtration, while the lignin and hemicellulose fractions remain in solution or in the filtrate. The cellulose fraction may then be washed and harvested.

In one embodiment, removing oxidation products of the redox reaction may result in a more complete reaction and better quality crystalline cellulose product. Therefore, in one embodiment, the filter cake from the first redox reaction may be resuspended in water and NaOH added to a pH of about 12.0. The mixture may then be stirred, with optional heating between about 50° and 95° C., and preferably between about 65° C. to about 85° C., until the pH stabilizes at about 10.0 or below. The lowering of the pH may be caused by organic acids dissolving or releasing into the alkaline suspension and neutralizing the hydroxide ions. The colour of the liquid will change from a yellowish orange to a dark brown. After the alkaline extraction, the suspension may be filtered and washed with water.

In one embodiment, the redox reaction process may be continued for a sufficient length of time, or repeated, to yield crystalline cellulose of a desired particle size or range of size. The length of time, number of repetitions and severity of the reaction conditions may be selected by one skilled in the art having regard to the quality or character of the cellulosic feedstock and of the desired product, and of economic factors. In general, the longer the reaction process, the greater the number of repetitions, and the more severe reaction conditions, will result in crystalline cellulose of smaller dimensions. The minimum length of time for any given set of reaction conditions may be determined by one skilled in the art by empirically sampling the reaction products and determining if the desired crystalline cellulose particles have formed. The appearance and/or quality of crystalline cellulose particles may easily be detected by particle size analysis, microscopic imaging and/or measuring the crystallinity index.

In one embodiment, and in particular after a single redox reaction, the crystalline cellulose may comprise granular MCC having an average particle size in the range of about 20 to 50 microns, similar to pharmaceutical grade MCC. This product may be further processed by suspension in water to produce a colloidal suspension, and allowing a larger fraction comprising primarily of MCC to settle and form a sediment on the bottom of the vessel. A fraction of smaller particles may remain in suspension and comprises crystalline cellulose having smaller dimensions, and may also comprise CNC.

Granular MCC may also be further processed using physical, physico-chemical, or chemical size reduction treatment, resulting in a mixture of colloidal microcrystalline cellulose having an average particle size between about 10 to 20 microns, and CNC. For example, MCC may be treated with ultrasound (sonication), microfluidized, blended, homogenized, ground or refined, or otherwise treated to reduce particle size. The colloidal cellulose fraction comprises high purity crystals with microscopic morphology substantially similar to the morphology of analytical grade microcrystalline cellulose, and may also include CNC.

If granular MCC is treated by a second redox reaction, the product becomes substantially pure CNC. Quality of the CNC product may be assessed on the following factors in Table 2:

TABLE 2

| Measurement | Good Quality | Poor Quality |
| --- | --- | --- |
| Cake on filter paper | Feels either rubbery or greasy | Feels soft or fibrous |
| Microscope image 10X | Very small visible particles. No particles after sonication | Visible fibres several microns in length |
| Visible appearance of gel or suspension | Clear or almost clear. Evidence of Rayleigh scattering. Sample goes clear with ultrasound | Opaque gel, white or off white. Remains opaque after ultrasound treatment |
| Size by DLS* | One size peak at around 100 nm. $Z_{ave}$ 100-200 nm | Two size peaks. One at 800 nm to 1,500 nm. $Z_{ave} > 300$ nm |
| Zeta Potential | Below -30 mV | Higher than -30 mV in association with settling particles |

Other measurements which may be made on the product include measurement of amount of carboxyl content on the surface of the CNC, by a conductimetric titration with hydrochloric acid and sodium hydroxide. Units are in mmol/g. The carboxyl content and conductivity may provide a measure for product purity.

EXAMPLES

The following examples are intended to illustrate aspects of the claimed invention, but not be limiting in any manner, unless explicitly recited as a limitation.

Example 1—First Redox Reaction

In one example, the first redox reaction was performed using sodium hypochlorite under the following conditions with one of A96 (96% alpha cellulose), Kraft bleached pulp, brown Kraft pulp (never dried), treated hemp pulp (Pure Lignin Environmental Technology—as described in US Patent Application 20050269048 A1). The catalyst was either ferric sulphate or cupric sulphate, either chelated or non-chelated, added as a 53.7 mmol/L solution:

TABLE 3

| First Redox Reaction | |
| --- | --- |
| Reaction Volume | 1 L |
| Biomass | 20 oven dried g of biomass |
| Biomass pretreatment | Soaking in reverse osmosis water |
| Catalyst added | 3.9 mL (0.209 mmol/L of iron sulfate or copper sulfate) |
| NaClO added | 90 mL of 8.5% or 60 mL of 12% sodium hypochlorite solution (0.1132 moles) |
| Buffer Added | 40 mL (1.0 L of buffer solution is prepared by dissolving 41.9 g of Trisodium Phosphate and 10.93 g of citric acid into reverse osmosis water.) |
| Reaction time | Hold until a rapid drop in ORP |
| Reaction Temperature | 75° C. |
| Control measurements | pH, ORP |

In this example, 5.65 mol NaOCl per kg of biomass is used. 60 mL of 12% NaOCl having a specific gravity of 1.19, wherein the molecular weight of NaOCl is 74.44 g/mol, provides.

FIG. 2 shows the reaction progress over time. As the reaction progresses, pH decreases while ORP increases slightly until the hyochlorite is completely consumed, at which point the ORP decreases rapidly to zero.

The ratios of sodium hypochlorite, copper catalyst and biomass in the first and second redox reaction are provided below in Table 4.

TABLE 4

| Reaction Ratios | | |
| --- | --- | --- |
| Ratios | First Redox | Second Redox |
| Oxidant/Cu | 549.4 | 549.4 mol/mol |
| Oxidant/Biomass | 428.4 | 428.4 mg/g |
| Cu/Biomass | 0.66 | 0.66 mg/g |

At the end of the first redox reaction, the biomass has substantially broken down compared to the start. This is visible as seen by the reduction in suspension viscosity as well as shortening of individual fibres as seen by ordinary light microscopy.

After the first redox reaction, the suspension is vacuum filtered with 5 μm size filter paper. When the suspension is almost dry, an additional 500 mL of reverse osmosis (RO) water is added and filtered through the resulting cake.

Example 2—Alkaline Extraction

Figure 3:
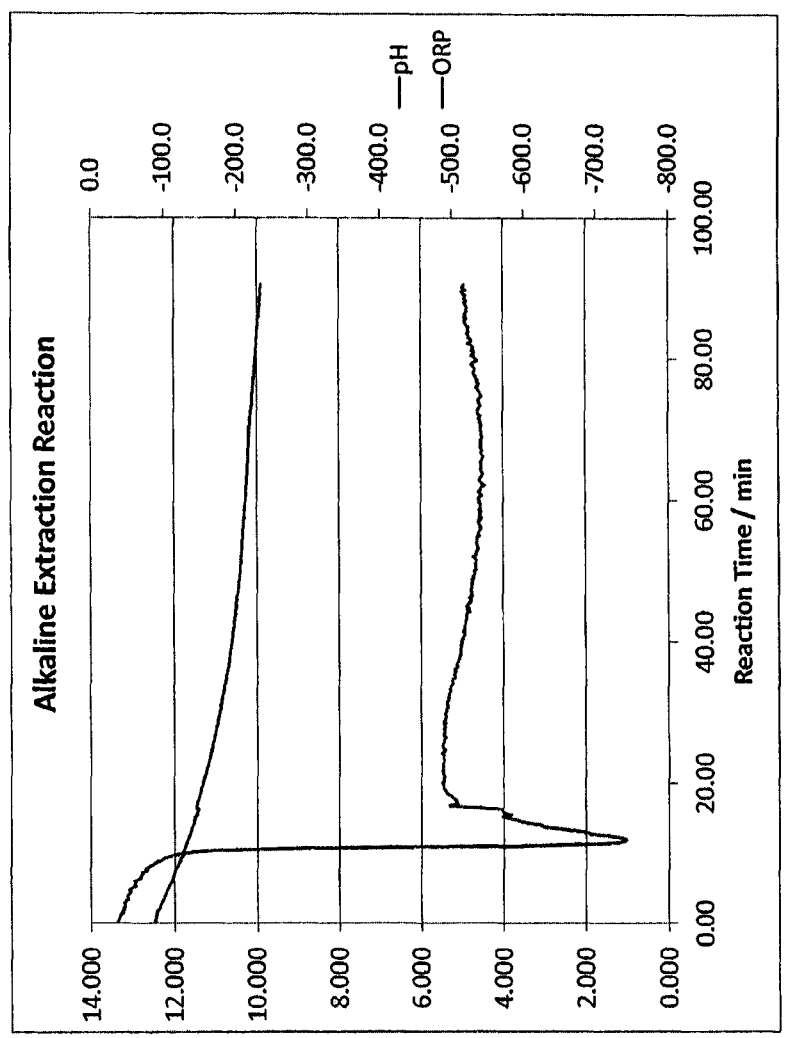
FIG. 3 shows a graph plotting pH and oxidation-reduction potential (ORP) during an alkaline extraction reaction.

In one embodiment, removing oxidation products of the first redox reaction may result in a more complete reaction and better quality crystalline cellulose product. The filter cake from the first redox reaction was resuspended in 1 L of water and NaOH added to a pH of 12.0-12.3. The mixture was then stirred at 85° C. for 1.5 hours, or until the pH goes below about 10.0. The lowering of the pH is caused by organic acids dissolving in the alkaline suspension and reacting with the dissolved hydroxide ions. Reaction conditions over time are shown in FIG. 3. After the pH stabilizes below about 10.0 and the ORP stabilizes at about −500 mV, the suspension is vacuum filtered with 5 μm size filter paper. When the suspension is almost dry, an additional 500 mL of RO water is added and filtered through the resulting cake.

Example 3—Second Redox

The second redox is similar to the conditions set out in the first redox. The cake (approximately 16 dry grams) from the alkaline extraction step is resuspended in water and subjected to the following treatment.

TABLE 5

| Second Redox Reaction | |
| --- | --- |
| Reaction Parameter | Description |
| Reaction Volume | 1 L |
| Catalyst added | 3.9 mL (0.089 mmol of copper sulfate) |
| NaClO added | 90 mL of 8.5% or 60 mL of 12% (0.1132 moles) |
| Buffer Added | 40 mL |
| Reaction time | Hold until a rapid drop in ORP (approximately 80 minutes) |
| Reaction Temperature | 75° C. |
| Control measurements | pH, ORP |

Figure 5A:
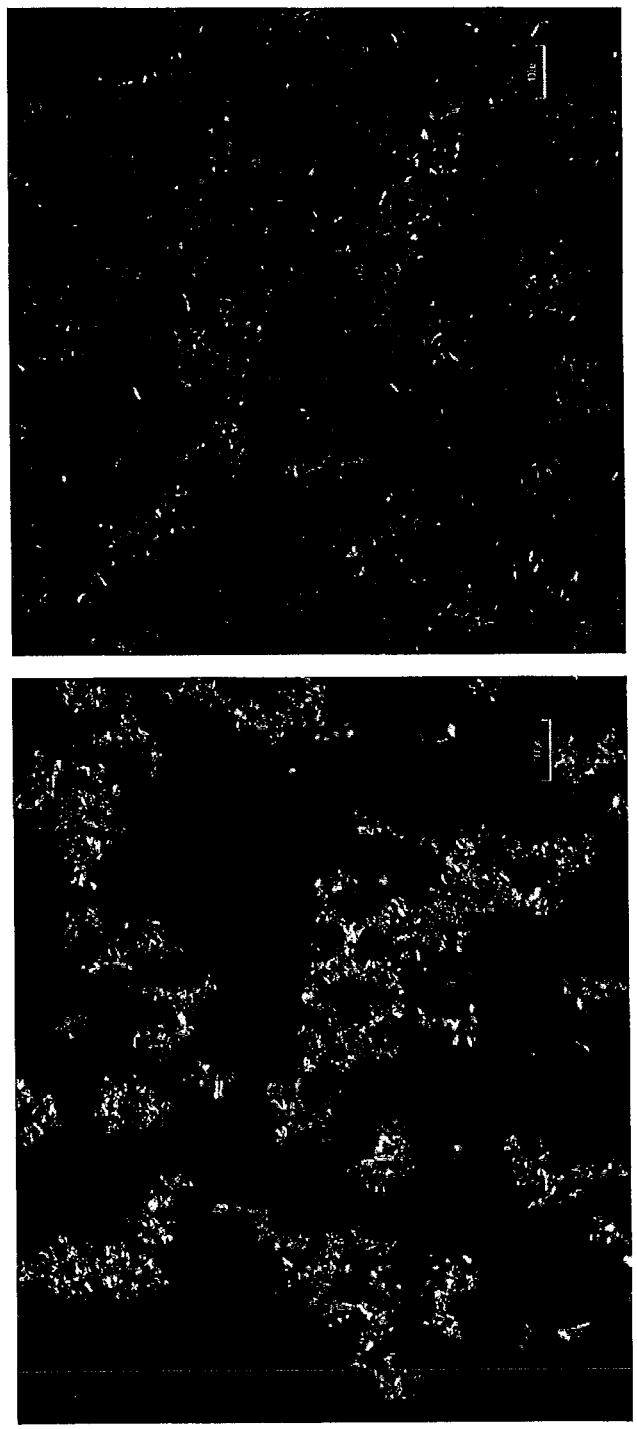
FIG. 5A shows photomicrographs of cellulosic material before (left) and after (right) a second redox reaction.

FIG. 5 shows photomicrographs of the reaction contents before (left) and after (right) the second redox reaction. The cellulosic material has lost its original fibre size and shape and CNC particles are observable with DLS. The larger particles are likely agglomerations of CNC, which may be broken up by sonication or other processing.

Example 4—Washing, Dewatering and Other Material Handling

The CNCs in suspension resulting from the second redox reaction has dissolved salts and organic oxidation products that are preferably removed. Suspension conductivity may be used to measure washing effectiveness. The CNC is washed until the suspension conductivity (at 1% w/w CNC) goes below about 50 μS/cm. The CNCs may still be slightly agglomerated at this point, so a brief treatment with ultrasound (Hielscher model UIP1000hd, 100% amplitude, 5-10 s) may be used to break up these agglomerates.

The following table shows product testing results and comments of selected batches of crystalline cellulose product produced by two rounds of redox reactions, with an alkaline extraction after the first. Results from dynamic light scattering using a Malvern Instruments Zetasizer Nano ZS™ show CNC particles having an average particle size of under about 450 nm, with a zeta potential of about—38.0 mV. Zeta potential is a measurement of electrical potential amongst colloidal particles and their interaction with the dispersing media. It is used as an indication of the stability of a colloidal dispersion. Low values (near zero) suggest the particles may coagulate and/or settle. High absolute values, for example greater than +30 mV, indicate good electrical stability of the colloid.

TABLE 4

Selected Results of Redox Treatments of different biomasses - Examples 1, 2 and 3

| Trial | Biomass | Treatment | Results |
|---|---|---|---|
| 1 | Acetate Grade Dissolving Pulp (A96) | Iron catalyst, Citric acid chelation | 212 nm average particle size. |
| 2 | A96 | Iron catalyst, EDTA chelation | 336 nm average particle size. Iron precipitate on filter paper. |
| 3 | A96 | Copper catalyst | 208 nm average particle size. Transparent after sonication |
| 4 | Bleached Kraft | Copper catalyst with citrix acid chelation. TSP Buffer | 96.98 nm average particle size, Zeta potential 40.1 mV |
| 5 | Brown Kraft, never dried | Copper catalyst | 223 nm average particle size. Transparent after sonication |
| 6 | Hemp pulp, partially treated, never dried (Pure Lignin ™) | Copper catalyst | Average particle size 450 nm before sonication. 97 nm after sonication. Samples showed distinct thixotropic behaviour |
| 7 | A96 | TSP citrate buffer, copper sulfate catalyst, 750 L pilot scale run | 311 nm average particle size before sonication, 89 nm after 15 second ultrasound treatment. |

Figure 5B:
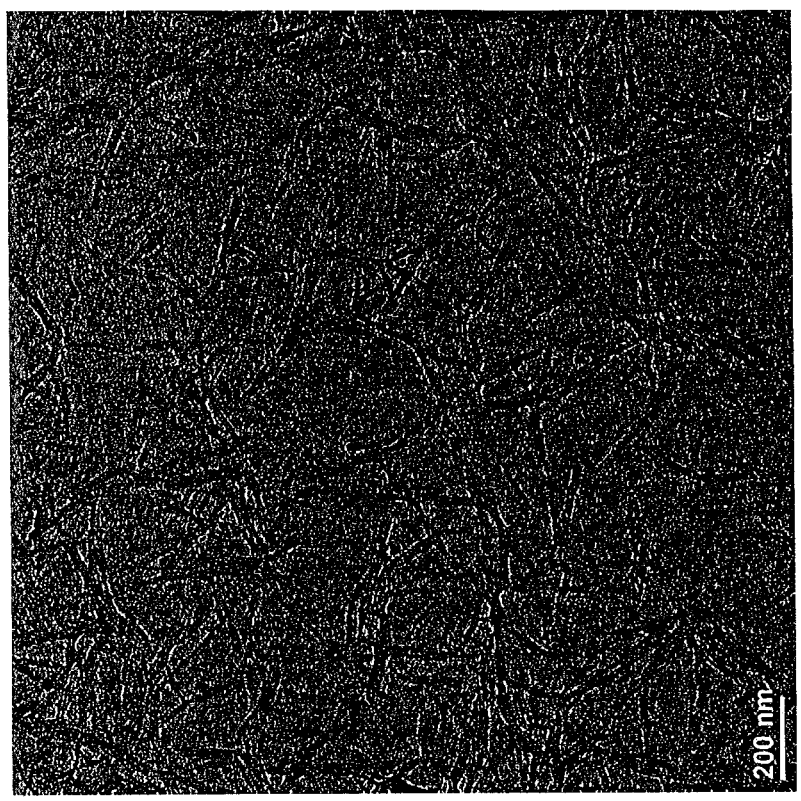
FIG. 5B shows a photomicrograph of cellulose nanocrystals (CNC).
Figure 6:
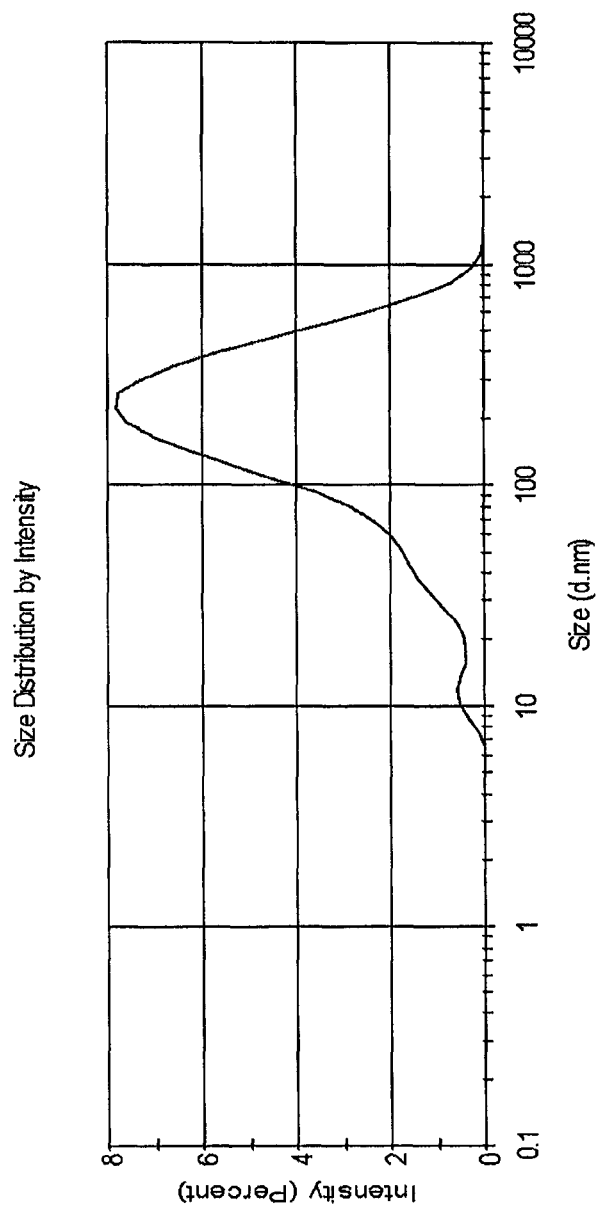
FIG. 6 shows the distribution of particle size of CNC, as measured by dynamic light scattering.
Figure 7:
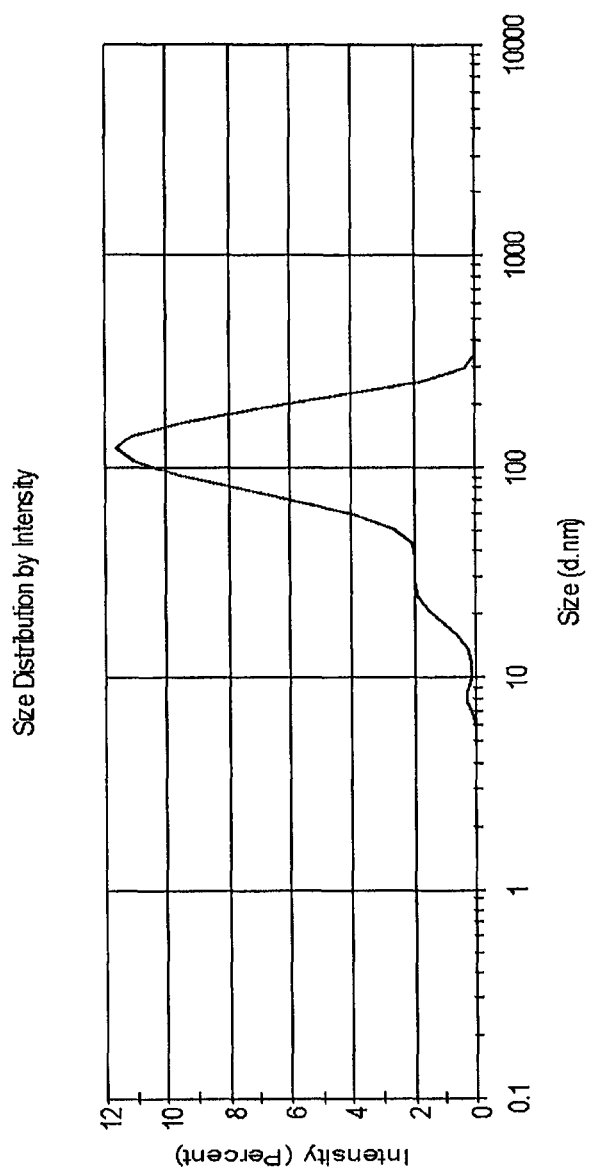
FIG. 7 shows the distribution of particle size of CNC after sonication, as measured by dynamic light scattering.

The resulting CNC appears to be uniform in size. As shown in FIG. 6, the average particle size is 212 nm from Trial #1. As shown in FIG. 7, the average particle size is 97 nm from Trial #4. A photomicrograph of the resulting CNC from Trial #7 is shown in FIG. 5B.

Example 5—Thixotropy

Thixotropy or non-Newtonian behavior is a property of high quality CNC suspensions with uniform size distribution. All samples showed thixotropic behaviour, indicating aspect ratios in the range of about 40 to 50.

Example 5—Multiple Additions of Oxidant

Figure 8:
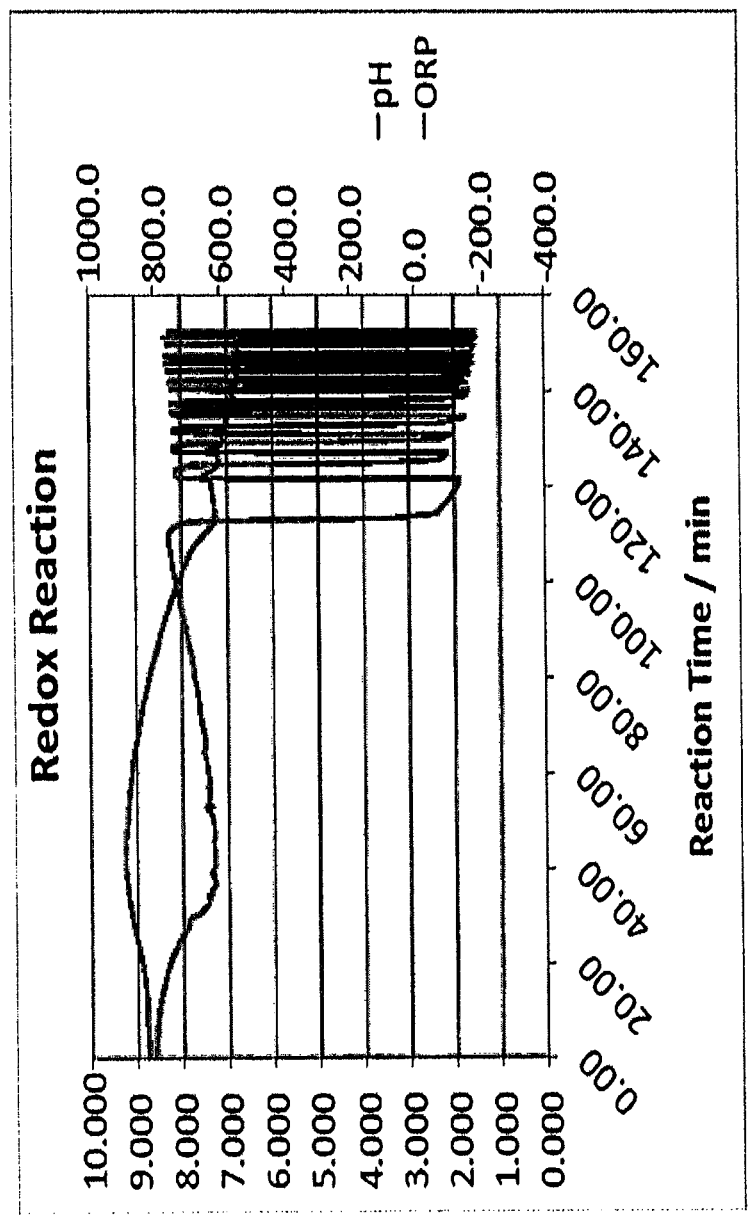
FIG. 8 shows a graph plotting pH and oxidation-reduction potential (ORP) during a redox reaction of the present invention, with multiple additions of hypochlorite.

In one example, crystalline cellulose was prepared from A96 cellulose with a single redox reaction, with additional dosing of hypochlorite towards the end of the reaction. In a total 1.0 L volume, with 10 g (dry weight) of A96, 120 ml of 12% NaOCl, 80 ml of buffer and 3.9 ml of copper catalyst. 60 ml of NaOCl was added with the initial mixture, followed by 12 additional 5 ml aliquots at each time the ORP dropped to about zero (see FIG. 8). The reaction temperature was 75° C.

TABLE 7

| Reactant Ratios | |
|---|---|
| Ratios | Redox |
| Oxidant/Cu | 549.4 mol/mol |
| Oxidant/Biomass | 856.8 mg/g |
| Cu/Biomass | 1.33 mg/g |

Figure 9:
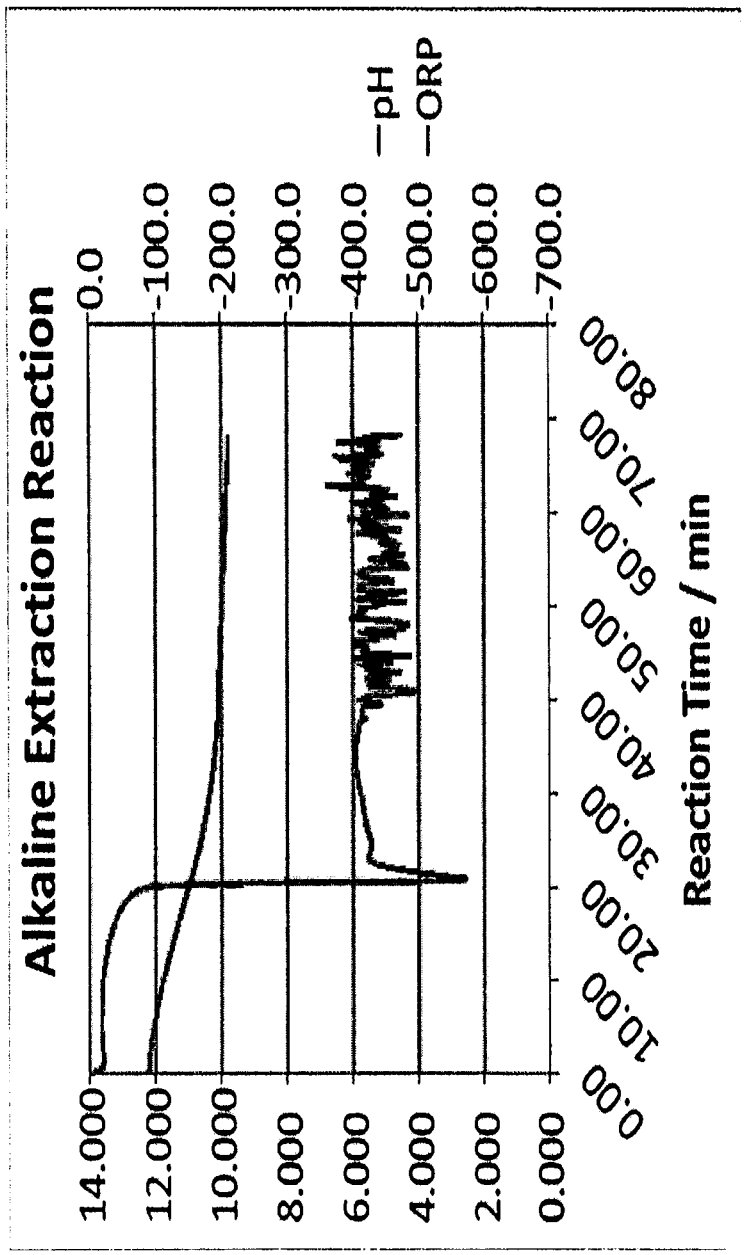
FIG. 9 shows a graph plotting pH and oxidation-reduction potential (ORP) during a alkaline extraction, after an initial redox reaction.
Figure 10:
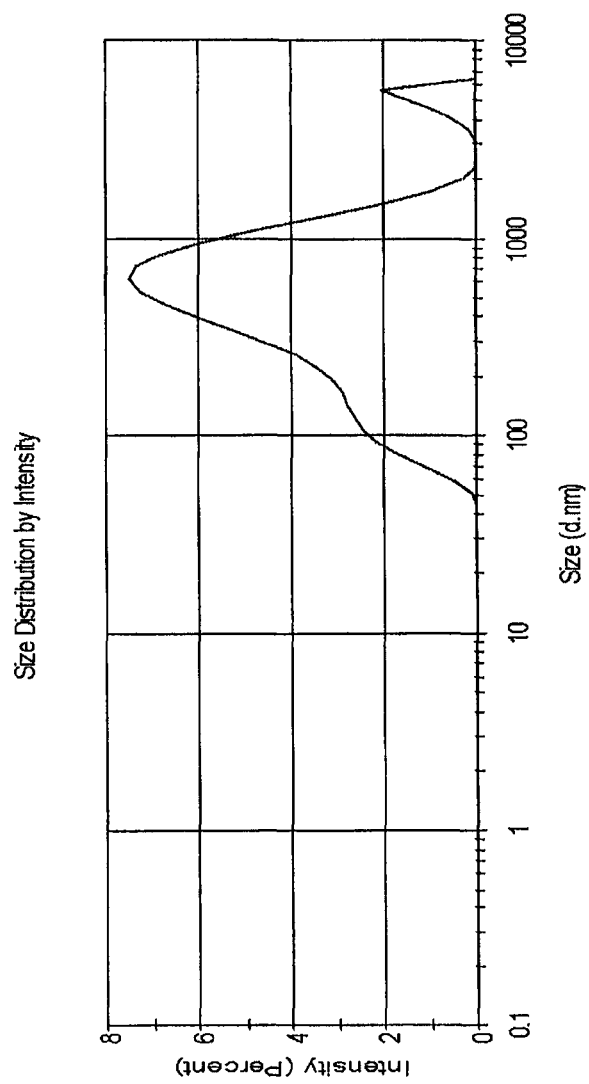
FIG. 10 shows the distribution of particle size of CNC and MCC, as measured by dynamic light scattering.

An alkaline extraction was performed as described above (see FIG. 9). The size distribution (FIG. 10) of the resulting product after alkaline extraction and 15 second sonication was a mixture of MCC as shown in the right hand peak of the size distribution graph, and CNC having an average particle size of about 347 nm (after sonication). The CNC was of reasonably uniform particle size distribution, as evidenced by the single peak below 1000 nm, although a portion had a particle size slightly above 1 micron.

This example shows that reasonable quality CNC may be produced with a single redox reaction with sequential addition of additional hypochlorite.

Example 6—Effect of Temperature

Figure 11:
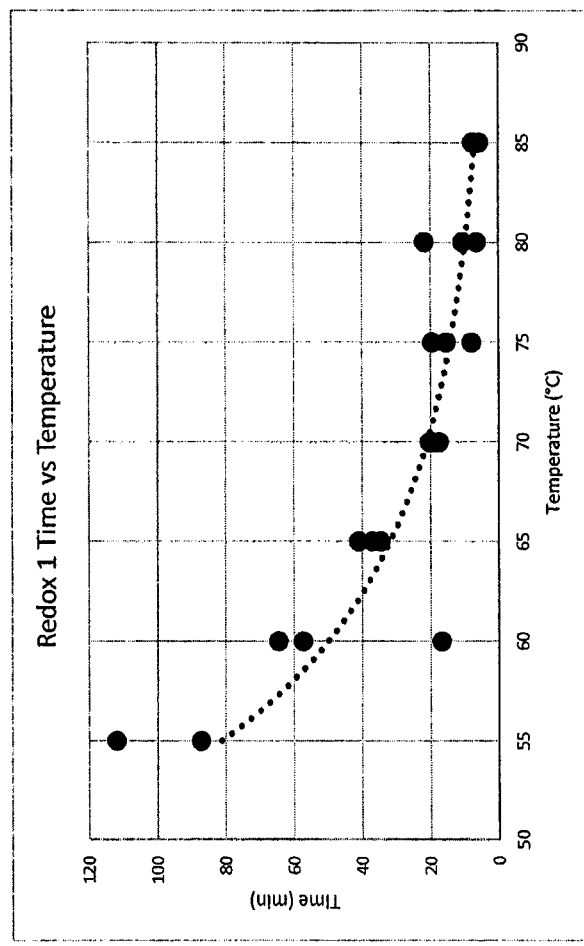
FIG. 11 shows a graph showing the relationship between temperature of a first redox reaction and time to completion.
Figure 12:
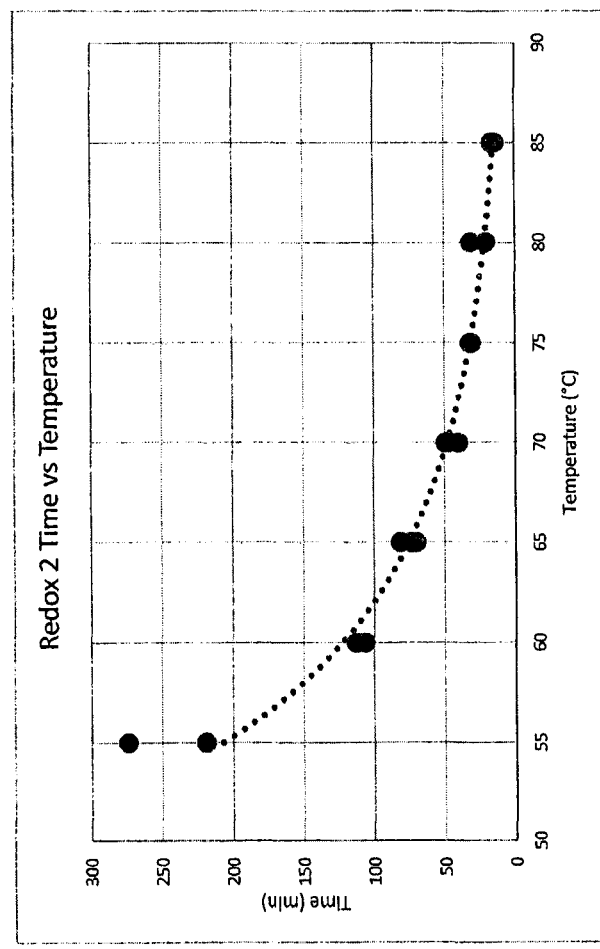
FIG. 12 shows a graph showing the relationship between temperature of a second redox reaction and time to completion.

All reactions were performed with 20 g A96, 8.9 g NaOCl, 40 mL of 0.625 M monosodium phosphate (MSP)/trisodium phosphate (TSP) buffer, and 52.3 mg copper sulfate pentahydrate, with an alkaline wash. The temperature of the first and second redox reactions was varied from 55° C. to 85° C. at 5° C. increments. Three trials were performed at each temperature. As shown in FIGS. 11 and 12, and in the following Table 8, reaction time decreased with increasing temperature. However, yield appears to decrease slightly with temperature. Size, carboxyl content, and zeta potential were relatively unaffected by temperature.

TABLE 8

Effect of reaction temperature on reaction time, yield and product quality.

| Temp °C. | First Reaction Time/min | | Second Reaction Time/min | | Yield/% | | Z Ave/nm | | Carboxyl Content mmol/g | Zeta Potential mV |
|---|---|---|---|---|---|---|---|---|---|---|
| | Average | St Dev | Average | St Dev | Average | St Dev | Average | St Dev | | |
| 55 | 99.7 | 17.5 | 246.8 | 39.0 | 50.3 | 7.9 | 110.7 | | 0.305 | |
| 60 | 46.2 | 25.8 | 110.3 | 3.5 | 49.5 | 1.6 | 107.8 | 4.3 | 0.214 | −36.2 |
| 65 | 37.5 | 3.3 | 74.9 | 5.8 | 43.5 | 5.0 | 93.0 | 9.0 | | −34.3 |
| 70 | 19.0 | 1.4 | 44.3 | 6.9 | 45.9 | 0.7 | 177.1 | 33.6 | 0.275 | −30.6 |
| 75 | 14.3 | 5.8 | 30.3 | 1.1 | 38.7 | 2.7 | 104.3 | 46.9 | 0.273 | −33.0 |
| 80 | 12.9 | 7.9 | 20.2 | 0.2 | 41.0 | 6.7 | 127.0 | 74.1 | 0.284 | −39.8 |
| 85 | 6.9 | 1.0 | 12.5 | 2.4 | 37.0 | 2.5 | 86.8 | 14.1 | 0.333 | −32.0 |

The reaction rate appears to follow the Arrhenius equation:

$$k = Ae^{\frac{-E_a}{RT}}$$

Where k is the rate constant, A is the frequency factor, $E_a$ is the activation energy, R is the gas constant, T is the temperature in Kelvin.

When ln(1/time) is plotted versus 1/Temperature, the intercept of the line is ln A and the slope is $-E_a/R$. Both lines showed a good fit to this relation.

TABLE 9

| | A/min$^{-1}$ | $E_a$/J/mol | $r^2$ |
|---|---|---|---|
| First Reaction | 8.48E+10 | 1,168 | 0.969 |
| Second Reaction | 2.6426E+12 | 1,340 | 0.991 |

Example 7—Effect of pH Control

Reactions were performed at 75° C. with 20 g A96, 8.9 g NaOCl, and 52.3 mg copper sulfate pentahydrate. The buffers tested were Citrate/TSP, MSP/TSP, Phosphoric Acid/TSP, sodium hydroxide (NaOH) added continually, NaOH at the beginning, and no buffer. The continual addition of NaOH was done to keep the final pH about 7.0. It was found that the fastest reactions occurred with NaOH added continuously and no buffer. Yield, size, and carboxyl content are relatively unaffected by the different buffers. Reaction without pH control was as fast and yielded the same quality CNC as the pH controlled reaction. Although buffers may be used in the NaOCl reaction, they are not necessary for the reaction to occur.

TABLE 10

Effect of pH control on reaction time, yield and product quality.

| Buffer | Redox 1 Time (min) | Redox 2 Time (min) | Yield % | Zave nm | Carboxyl Content mmol/g | Zeta Potential mV |
|---|---|---|---|---|---|---|
| Citrate/TSP | 36.8 | 41.4 | 49.4 | 95.1 | 0.260 | — |
| None | 16.1 | 13.2 | 40.2 | 128.0 | 0.265 | — |
| NaOH increments | 7.3 | 16.4 | 38.9 | 90.1 | 0.286 | −39.0 |
| NaOH front loaded | 38.8 | 69.2 | 47.7 | 108.3 | 0.282 | — |
| MSP/TSP | 14.3 | 31.2 | 38.7 | 104.3 | 0.273 | −33.0 |
| TSP/Phosphoric Acid | 11.1 | 31 | 34.7 | 92.2 | 0.246 | — |

Example 7—Effect of Catalyst Variation

Two different standards were used to see the effect of different types and varying amounts of catalysts. Experiments were performed with no buffer, or NaOH added continuously to 20 g of A96 with 8.9 g NaOCl. The different types of catalyst tested were copper (II) sulfate pentahydrate, ferrous sulfate heptahydrate, manganese sulfate monohydrate, and no catalyst. 0.210 mmol of catalyst was added.

TABLE 11

Effect of catalyst type on reaction time, yield and product quality.

| Catalyst | First Reaction Time/min Average | Std Dev | Second Reaction Time/min Average | Std Dev | Yield/% Average | Std Dev | Z Ave/nm Average | Std Dev | Carboxyl Content mmol/kg | Zeta Potential mV |
|---|---|---|---|---|---|---|---|---|---|---|
| Copper | 16.1 | 9.7 | 13.2 | 4.9 | 40.2 | 2.3 | 128.0 | 13.5 | 0.266 | −31.0 |
| Iron | 21.2 | 3.0 | 36.7 | 10.8 | 31.1 | 1.4 | 244.7 | 36.1 | 0.269 | −33.6 |
| Manganese | 17.4 | 0.9 | 45.6 | 1.3 | 38.3 | 10.1 | 350.7 | 12.6 | 0.261 | −30.9 |
| No Catalyst | 104.2 | 41.0 | 109.3 | 6.9 | 56.4 | 5.7 | 251.0 | 4.9 | 0.235 | −31.2 |
| No catalyst EDTA Chelated | 62.8 | 10.8 | 78.9 | 19.9 | 72.95 | 4.6 | 729.0 | — | — | — |

To determine the effect of the amount of catalyst, the standard reactions were conducted with varying amounts of catalyst. The results are shown in Table 12. All three amounts of catalyst produced CNC, but the process was fastest when more was added. Yield, size, and carboxyl content were unaffected by the amount of catalyst. Both the no buffer and NaOH produced relatively the same quality of products.

TABLE 12

Effect of catalyst concentration on reaction time, yield and product quality.

| Copper Conc. mmol/L | First Reaction Time/min Avg | St Dev | Second Reaction Time/min Avg | St Dev | Yield/% Avg | St Dev | Zave/nm Avg | St Dev | Carboxyl Content mmol/g | Zeta Potential mV |
|---|---|---|---|---|---|---|---|---|---|---|
| 0.021 | 18.0 | 7.9 | 30.8 | 5.6 | 39.4 | 4.2 | 117.9 | 26.9 | 0.296 | −34.6 |
| 0.210 | 16.1 | 9.7 | 13.2 | 4.9 | 40.2 | 2.2 | 128.0 | 13.5 | 0.267 | −35.0 |
| 0.420 | 3.0 | 0.6 | 10.2 | 3.0 | 34.2 | 4.1 | 120.7 | 41.5 | 0.286 | −31.3 |

Example 8—Effect of Oxidant Loading

Different amounts of NaOCl were tested to find the minimum amount required for the reaction to effectively proceed and to determine the effect the amount of NaOCl has on the reaction. Each reaction was performed at 75° C. with 20 g A96, no buffer, and 0.210 mmol of copper sulfate pentahydrate. NaOCl was front loaded to the first and second redox at masses of 5.9 g, 7.4 g, 8.9 g, 11.9 g, and 14.9 g. 5.9 g NaOCl was not enough for the reaction to go to completion. As the amount of NaOCl increased, time required for the first redox decreased, time required for the second redox increased, yield decreased, and number of carboxyl groups increased. The difference in size and zeta potential was negligible.

When NaOCl was front loaded at 8.9 g to the first redox and 11.9 g and 14.9 g to the second redox, a similar pattern was observed. With more NaOCl, the more time the reaction required, the lower the yield, and the more carboxyl groups. The differences in size and zeta potential were also negligible for these tests.

In tests where a total of 8.9 g of NaOCl was added in 0.5 g increments after an initial dose of 4.5 g or 3.0 g added at the start of the reaction, similar results from the tests at 4.5 g NaOCl and 3.0 g were seen. The front-loaded tests and incremented tests were also relatively the same, indicating only the volume of NaOCl has an effect on the reaction, not the method of addition.

Example 9—Application to Different Biomasses

A standard reaction was performed with biomasses A96, TeMCC, V91, Hardwood Kraft, Softwood Kraft, and Yreka. 20 g of solids of each biomass was reacted at 75° C., without buffer, and 3.9 mL JS16. Results are shown in Table 13.

A96 is a high purity (96% alpha cellulose) and V91 (91% alpha cellulose) are high purity dissolving grade wood pulp produced at Neucel's Port Alice, BC mill. A96 is the raw material for the production of cellulose acetate. V91 is the raw material for the production of viscose.

TeMCC is the wood pulp that Tembec in Temiscaming, Quebec which is supplied to producers of MCC. It is also high purity (91% alpha cellulose).

The hardwood Kraft pulp is a typical Kraft pulp that was produced in Prince Albert, SK. The softwood Kraft pulp is a typical Kraft pulp that was produced in Prince Albert, SK. Kraft pulp tends to be lower in cellulose (85% alpha cellulose) but it is more plentiful and less expensive than dissolving pulp. The softwood wood source is Jack Pine, White Spruce and/or Black Spruce. The main difference between softwood and hardwood pulp is the length of the individual fibres. Softwood fibre length is approximately 2.5 mm, while hardwood fibre length is 0.70 mm. This difference causes softwood pulp to be much stronger than hardwood pulp. Softwood Kraft is used in printing and writing paper to increase its sheet strength, allowing for faster paper machine speeds and lighter weight paper.

Yreka comprises wood chips converted into medium density fibreboard by a high temperature refining of the chips. The resulting material is fibrous, but high in lignin. The cellulose content is the same as wood, or 40-45%.

Chempolis is straw fiber paper grade pulp produced by a formic acid pulping technology (Chempolis, Finland).

TABLE 13

Oxidant requirement, yield and product quality for different biomass sources.

| Biomass | NaOCl/biomass g/g | | Yield | Zave | Carboxyl Content mmol/g | Zeta Potential mV |
|---|---|---|---|---|---|---|
| | First Reaction | Second Oxidation | | | | |
| A96 | 0.37 | 0.37 | 38.8% | 173.0 | 0.216 | −30.6 |
| TeMCC | 0.65 | 0.43 | 32.6% | 95.0 | 0.280 | −34.9 |
| V91 | 0.65 | 0.43 | 34.2% | 151.0 | 0.232 | −31.2 |
| Hardwood Kraft | 0.65 | 0.65 | 26.3% | 159.4 | 0.324 | −44.5 |
| Softwood Kraft | 0.72 | 0.72 | 20.7% | 125.6 | 0.293 | −42.3 |
| Yreka MDF | 0.72 | 0.72 | 9.7% | 88.4 | | |
| Chempolis Wheat Straw | 0.65 | 0.65 | 27.7% | 109.0 | | |

The amount of NaOCl required for the biomass to produce CNC reflects the amount of lignin and waste product in the biomass. All of the biomasses required relatively the same amount of time for the reactions. A96, V91, and TeMCC had similar yields and size. Hardwood Kraft, Softwood Kraft, and Yreka had lower yields, likely because they required more NaOCl and started with more waste. The quality of Hardwood Kraft and Softwood Kraft was also lower than the other biomasses. The number of carboxyl groups and zeta potential reflected the amount of NaOCl added; large amounts of NaOCl resulted in a large number of carboxyl groups and very negative zeta potential. All of the biomasses tested produced acceptable CNC.

Example 10—Additional Tests and Findings

Additional tests were performed to provide more understanding and information for the patent. Another standard reaction was performed with tap water instead of reverse osmosis (RO) water. The original tests of temperature were done with buffer, so tests were performed to see how long the reaction would take without buffer at lower temperatures. The tests were performed with 20 g A96 at 60° C., 0.210 mmol of copper (II) sulfate pentahydrate, and 8.6 g NaOCl. The reactions at 60° C. showed similar results as with buffer, but at a greater speed.

TABLE 14

Results of additional conditions testing.

| Reaction | Standard Reaction | No Wash | No Alkaline Extraction | Tap Water | 60° C. No Buffer |
|---|---|---|---|---|---|
| NaOCl Redox 1/g | 8.6 | 8.6 | 21.6 | 8.6 | 8.6 |
| Redox Time 1/min | 3.5 | 8.9 | 6.4 | 11.3 | 14.2 |
| NaOCl Redox 2/g | 8.6 | 8.6 | 21.6 | 8.6 | 8.6 |
| Redox Time 2/min | 7.4 | 9.4 | 7.3 | 18.0 | 45.2 |
| Yield/% | 38.3 | 46.2 | 28.9 | 55.5 | 46.0 |
| Zave/nm | 173.0 | 271.4 | 129.4 | 176.4 | 143.8 |

A typical reaction was performed without washing in between reactions to see if quality CNC could still be made. Table 15 shows that the yield and average particle size increased, suggesting a reaction that did not go to completion. It seems likely that oxidation products that are normally washed off of the biomass are competing with the biomass for oxidation. This likely limits the extent of the desired reaction. This may be overcome by adding more oxidant to the reaction.

A study was done to determine how much oxidant was required to generate CNC of the same quality as the original protocol if the alkaline extraction step is omitted. The results show that it takes 2.5 times as much oxidant as the standard protocol, resulting in a 10% lower product yield.

The redox process preferably uses reverse osmosis water for dilution and wash water. The results shows that yield is increased and the reaction is slower when using tap water (City of Saskatoon). This reaction was successful as long as the final wash was with RO water and the final product was re-suspended in RO water. This suggests that washing may not be as efficient with tap water, or something in the tap water could be interfering with the catalyst or other reaction component.

In order to determine the effect of solids loading, an experiment was done with no added water. A96 was added directly to 12% sodium hypochlorite then heated. 83 g of A96 was treated in 250 mL of 12% sodium hypochlorite. 0.210 mmol of copper (II) sulfate pentahydrate was used in both redox reactions. Table 15 shows that the protocol generated crystalline cellulose, but not the same quality and yield as a process which uses lower solids loading and more dilute solution.

TABLE 15

Results of high biomass loading on product quality.

| Measurement | Result |
|---|---|
| Redox 1 Time/min | 16.0 |
| Redox 1 final pH | 3.41 |
| Redox 2 Time/min | 25.2 |
| Redox 2 pH | 3.48 |
| Zave/nm | 660.2 |
| Yield/% | 54.5 |

DEFINITIONS AND INTERPRETATION

The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. Embodiments were chosen and described in order to best explain the principles of the invention and the practical application, and to enable others of ordinary skill in the art to understand the invention for various embodiments with various modifications as are suited to the particular use contemplated.

The corresponding structures, materials, acts, and equivalents of all means or steps plus function elements in the claims appended to this specification are intended to include any structure, material, or act for performing the function in combination with other claimed elements as specifically claimed.

References in the specification to "one embodiment", "an embodiment", etc., indicate that the embodiment described may include a particular aspect, feature, structure, or characteristic, but not every embodiment necessarily includes that aspect, feature, structure, or characteristic. Moreover, such phrases may, but do not necessarily, refer to the same embodiment referred to in other portions of the specification. Further, when a particular aspect, feature, structure, or characteristic is described in connection with an embodiment, it is within the knowledge of one skilled in the art to affect or connect such aspect, feature, structure, or characteristic with other embodiments, whether or not explicitly described. In other words, any element or feature may be combined with any other element or feature in different embodiments, unless there is an obvious or inherent incompatibility between the two, or it is specifically excluded.

It is further noted that the claims may be drafted to exclude any optional element. As such, this statement is intended to serve as antecedent basis for the use of exclusive terminology, such as "solely," "only," and the like, in connection with the recitation of claim elements or use of a "negative" limitation. The terms "preferably," "preferred," "prefer," "optionally," "may," and similar terms are used to indicate that an item, condition or step being referred to is an optional (not required) feature of the invention.

The singular forms "a," "an," and "the" include the plural reference unless the context clearly dictates otherwise. The term "and/or" means any one of the items, any combination of the items, or all of the items with which this term is associated.

As will be understood by the skilled artisan, all numbers, including those expressing quantities of reagents or ingredients, properties such as molecular weight, reaction conditions, and so forth, are approximations and are understood as being optionally modified in all instances by the term "about." These values can vary depending upon the desired properties sought to be obtained by those skilled in the art utilizing the teachings of the descriptions herein. It is also understood that such values inherently contain variability necessarily resulting from the standard deviations found in their respective testing measurements.

The term "about" can refer to a variation of ±5%, ±10%, ±20%, or ±25% of the value specified. For example, "about 50" percent can in some embodiments carry a variation from 45 to 55 percent. For integer ranges, the term "about" can include one or two integers greater than and/or less than a recited integer at each end of the range. Unless indicated otherwise herein, the term "about" is intended to include values and ranges proximate to the recited range that are equivalent in terms of the functionality of the composition, or the embodiment.

As will be understood by one skilled in the art, for any and all purposes, particularly in terms of providing a written description, all ranges recited herein also encompass any and all possible sub-ranges and combinations of sub-ranges thereof, as well as the individual values making up the range, particularly integer values. A recited range (e.g., weight percents or carbon groups) includes each specific value, integer, decimal, or identity within the range. Any listed range can be easily recognized as sufficiently describing and enabling the same range being broken down into at least equal halves, thirds, quarters, fifths, or tenths. As a non-limiting example, each range discussed herein can be readily broken down into a lower third, middle third and upper third, etc.

As will also be understood by one skilled in the art, all language such as "up to", "at least", "greater than", "less than", "more than", "or more", and the like, include the number recited and such terms refer to ranges that can be subsequently broken down into sub-ranges as discussed above. In the same manner, all ratios recited herein also include all sub-ratios falling within the broader ratio. Accordingly, specific values recited for radicals, substituents, and ranges, are for illustration only; they do not exclude other defined values or other values within defined ranges for radicals and substituents.

One skilled in the art will also readily recognize that where members are grouped together in a common manner, such as in a Markush group, the invention encompasses not only the entire group listed as a whole, but each member of the group individually and all possible subgroups of the main group. Additionally, for all purposes, the invention encompasses not only the main group, but also the main group absent one or more of the group members. The invention therefore envisages the explicit exclusion of any one or more of members of a recited group. Accordingly, provisos may apply to any of the disclosed categories or embodiments whereby any one or more of the recited elements, species, or embodiments, may be excluded from such categories or embodiments, for example, as used in an explicit negative limitation.

The invention claimed is:

1. A method of producing substantially pure cellulose nanocrystals (CNCs) from a cellulosic material, comprising the steps of:
   (a) reacting the cellulosic material in a first redox reaction, in an aqueous slurry comprising a transition metal catalyst and a hypohalite solution to produce crystalline cellulose;
   (b) reacting the crystalline cellulose in a second redox reaction, in an aqueous slurry comprising a transition metal catalyst and a hypohalite solution to produce substantially pure CNCs.

2. The method of claim 1 wherein the hypohalite comprises hypochlorite, hypoiodite, or hypobromite, and the concentration of the hypohalite is between about 0.10M and 0.5M.

3. The method of claim 1 wherein the initial pH of the slurry in either or both the first redox reaction or the second redox reaction is between 9.0 to 12.0.

4. The method of claim 1 wherein the final pH of the slurry in either or both the first redox reaction or the second redox reaction is below 8.0.

5. The method of claim 4 wherein the final pH of the slurry in either or both the first redox reaction or the second redox reaction is below about 7.0.

6. The method of claim 1, wherein the slurry in either or both the first redox reaction or the second redox reaction has an initial oxidation-reduction potential (ORP) of greater than about 500 mV.

7. The method of claim 6 wherein the slurry has a final ORP of less than about 0.0 mV.

8. The method of claim 1 wherein the slurry in either or both the first redox reaction or the second redox reaction further comprises a buffer.

9. The method of claim 8 wherein the buffer comprises a phosphate and a polyvalent organic acid.

10. The method of claim 2 wherein the ratio of hypohalite to cellulosic material in the slurry in the first redox reaction is between about 1 mol/kg to about 10 mol/kg (dry weight basis).

11. The reaction of claim 1 wherein the slurry in either or both the first redox reaction or the second redox reaction is heated to between about 50° C. and about 85° C.

12. The method of claim 1 further comprising a step washing the crystalline cellulose produced by the first redox reaction in an alkaline solution.

13. The method of claim 12 wherein the alkaline solution comprises a solution of NaOH having a pH of about 12.0.

14. The method of claim 13 wherein the alkaline solution is heated to between about 30° C. and about 90° C.

15. The method of claim 1 wherein the substantially pure CNCs have a particle size distribution with a single peak less than about 300 nm.

16. The method of claim 15 wherein the substantially pure CNCs have a particle size distribution with a single peak less than about 200 nm.

17. The method of claim 1 wherein the substantially pure CNCs have a surface carboxyl content of less than about 0.33 mmol/gram.

18. The method of claim 1 wherein the cellulosic material comprises alpha cellulose, dissolving pulp, bleached or brown Kraft pulp, or hemp pulp.

* * * * *